United States Patent
Chen et al.

[11] Patent Number: 5,976,984
[45] Date of Patent: Nov. 2, 1999

[54] PROCESS OF MAKING UNLANDED VIAS

[75] Inventors: Coming Chen, Taoyuan Hsien; Chih-Chien Liu, Taipei; Kun-Chih Wang, Tucheng; Tri-Rung Yew, Hsinchu Hsien, all of Taiwan

[73] Assignee: United Microelectronics Corp., Taiwan

[21] Appl. No.: 09/001,416

[22] Filed: Dec. 30, 1997

[30] Foreign Application Priority Data

Oct. 29, 1997 [TW] Taiwan ................................ 86116029

[51] Int. Cl.⁶ .................................................. H01L 21/02
[52] U.S. Cl. .......................... 438/700; 438/706; 438/710
[58] Field of Search ................................ 438/627, 626, 438/637, 706, 710, 700

[56] References Cited

U.S. PATENT DOCUMENTS

| | | | |
|---|---|---|---|
| 5,726,100 | 3/1998 | Givens | 438/702 |
| 5,728,628 | 3/1998 | Havemann | 438/668 |
| 5,854,131 | 12/1998 | Dawson et al. | 438/666 |

*Primary Examiner*—Benjamin Utech
*Assistant Examiner*—Lynette T. Umez-Eronini
*Attorney, Agent, or Firm*—Rabin & Champagne, P.C.

[57] ABSTRACT

A method of making vias in a semiconductor IC device having adequate contact to the surface of the interconnects and without inadequate landing is disclosed. The method has interconnects formed in a metal layer on the substrate of the IC device, and a first dielectric layer is formed covering the surface of the interconnects. An etch-stopping layer is then formed on top of the first dielectric layer, followed by the formation of a second dielectric layer on top of the etch-stopping layer. A photoresist layer then covers the second dielectric layer and reveals the surface regions of the second dielectric layer designated for the formation of the vias. A main etching procedure is then performed to etch into the second dielectric layer down to the surface of the etch-stopping layer, thereby forming the first section of the vias. An over-etching procedure is then implemented to strip off the etch-stopping layer and further etches into the first dielectric layer and the etching is then stopped when the surface of the interconnects are revealed to conclude the formation of the vias.

13 Claims, 5 Drawing Sheets

PROCESS OF MAKING UNLANDED VIAS

BACKGROUND OF THE INVENTION

1. Field of the Invention

This invention relates in general to a process of fabricating semiconductor integrated circuit devices and, in particular, to a process of fabricating multi-level interconnects for the IC devices. More particularly, this invention relates to a process of fabricating unlanded vias for multi-level interconnects for IC devices.

2. Description of Related Art

As the integration density of semiconductor IC devices increases as a result of technology advancements brought about by refined fabrication resolution, more circuit elements are required to be packed into the same surface area of the device substrate. Supports for circuit elements such as interconnects necessary between MOS transistors of the IC device are also required to be fabricated in the same device substrate. Device configurations with multi-leveled designs utilizing multiple layers of metal to contain these interconnects are therefore developed to incorporate these high-density devices.

Between these multiple layers, electrically insulating material known as intermetal dielectrics are used in these configurations to provide isolation in between the layers. Vias are formed in these inter-metal dielectric layers that can be filled with electrically conductive material to form plugs that provide electrical connection between the interconnects in different metal layers.

Conventional fabrication methods employ the technique of photolithography to form vias in an inter-metal dielectric layer by etching into the dielectric layer covered by pattered photoresist layers. Plugs are formed inside these vias by deposition of selected electrically conductive material into the via holes. FIGS. 1A to 1C depict one such conventional fabrication process for making these plugs which is briefly examined bellow.

First, as is illustrated in FIG. 1A, interconnects 12 formed in the metal layer are covered by an inter-metal dielectric layer 16 that provides electrical insulation from other portions of the device. Though not shown in the drawing, however, circuit elements such as MOS transistors formed in the device substrate may be present directly underneath the interconnects 12, as is appreciable by those skilled in the art. Then, after the formation of the inter-metal dielectric layer 16, a photoresist may be formed over the surface of the dielectric and patterned into the desired configuration. Such patterns expose locations in the photoresist where the vias are to be formed, as is clearly seen in the configuration of the photoresist layer 20 schematically shown in the drawing.

Then, in FIG. 1B, etching procedures such as dry etching can be employed to remove the selected regions of the inter-metal dielectric layer 16, forming the vias 18 in the dielectric 16. In general, the etching in the inter-metal dielectric layer 16 can be a two-stage process. In the main etching stage, the majority of the material thickness of the inter-metal dielectric 16 of the intended vias 18 can be removed by etching, but the bottom of the vias at this stage may have not reached the metal layer 12 yet. In a following over-etching stage, residual material in the inter-metal dielectric layer 16 in the regions of the vias 18 is removed, ensuring that the vias 18 reach the metal layer 12.

After the formation of the vias 18 as illustrated in FIG. 1B, plugs 28 shown in FIG. 1C can be formed by deposition of electrically conductive material in the via holes. An etching-back processing based on dry etching or chemical-mechanical polishing (CMP) can then be performed to finish the plugs 28, and another metal layer 22 can then be formed over the surface of the inter-metal dielectric layer 16 that can be used for the fabrication of another layer of interconnects.

In these conventional methods for forming vias 18, the etching operation in the main and over-etching stages is controlled on a time basis. However, etching timing control based on the estimation of the thickness of the inter-metal dielectric layer 16 can be tricky, with the etching results quite different. For example, typical procedures may need about 60 seconds for the main etching stage while only about 10 for the over-etching.

Since the inter-metal dielectric layer 16 is typically much thicker than other layers in the device, if the etch timing control is not governed well, there may be occasions wherein the vias do not reach to the metal layer 12, as is schematically depicted in the cross-sectional view of FIG. 2. Or, there may be occasions wherein the vias penetrate entirely through the inter-metal dielectric 16 to become short-circuited with the MOS transistor, as in FIG. 3, when they land on the device substrate. This later scenario is possible as the IC devices are required to pack more smaller circuit elements and the processing alignment becomes more difficult. The short-circuiting condition demonstrated in FIG. 3 is a result of misalignment of the via with the interconnect it is supposed to contact.

SUMMARY OF THE INVENTION

It is therefore an object of the invention to provide a method of fabricating vias in the inter-metal dielectric layers so that plugs can be formed without insufficient penetration or inadequate landing to lead to the undesirable open- or short-circuiting conditions respectively in the IC circuitry.

To achieve the above-identified object of the invention, a method of fabricating vias in a semiconductor IC device having adequate contact to the surface of the interconnects and without inadequate landing is provided. The method has interconnects formed in a metal layer on the substrate of the IC device, and a first dielectric layer is formed covering the surface of the interconnects. An etch-stopping layer is then formed on top of the first dielectric layer, followed by the formation of a second dielectric layer on top of the etch-stopping, layer. A photoresist layer then covers the second dielectric layer and reveals the surface regions of the second dielectric layer designated for the formation of the vias. A main etching procedure is then performed to etch into the second dielectric layer down to the surface of the etch-stopping layer, thereby forming the first section of the vias. An over-etching procedure is then implemented to strip off the etch-stopping layer in the vias and further etches into the first dielectric layer, and then the etching is stopped when the surface of the interconnects are revealed to conclude the formation of the vias. Plugs may then formed inside the vias.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
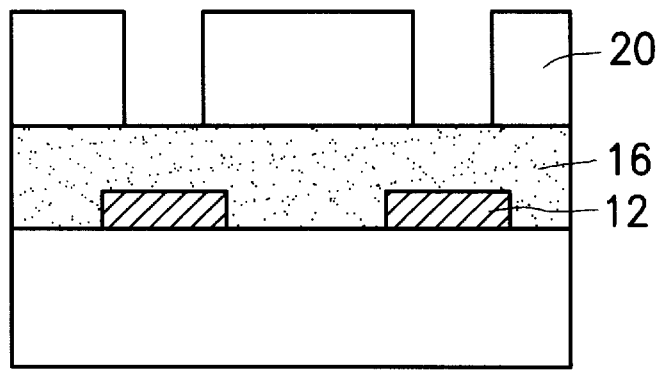
FIGS. 1A–1C are cross-sectional views depicted from a conventional process for fabricating via plugs connecting to interconnects.
Figure 1B:
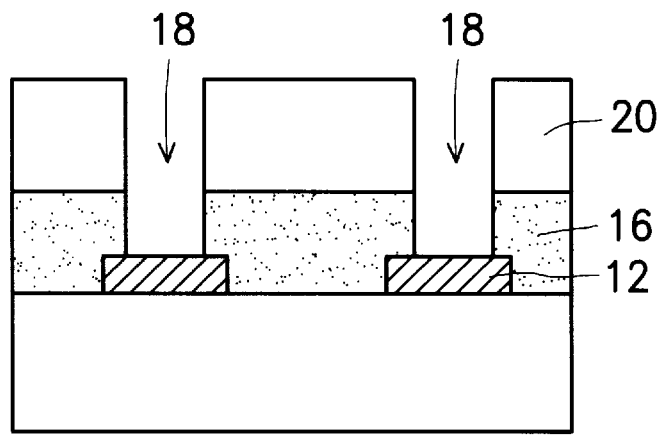
Figure 1C:
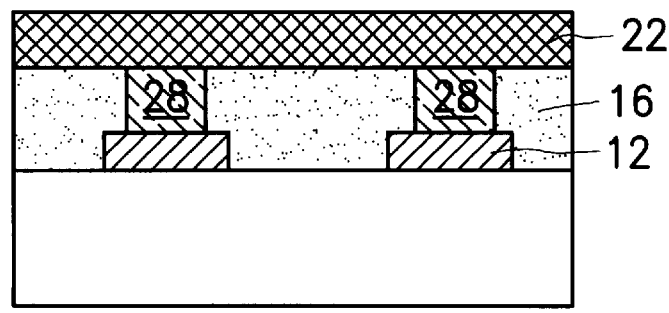
Figure 2:
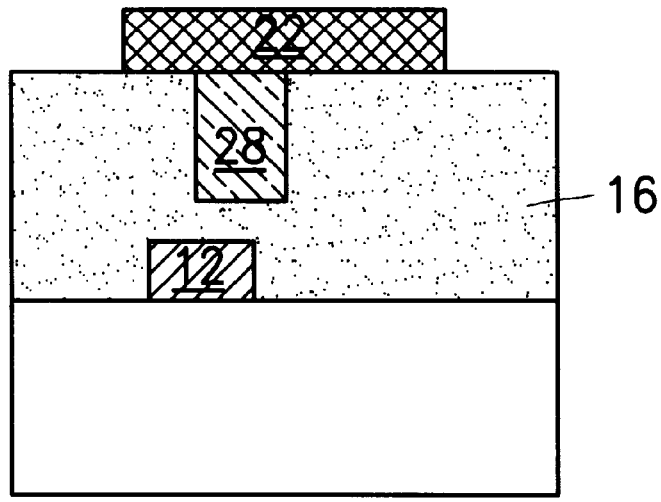
FIG. 2 is a cross-sectional view showing inadequately fabricated unlanded vias.
Figure 3:
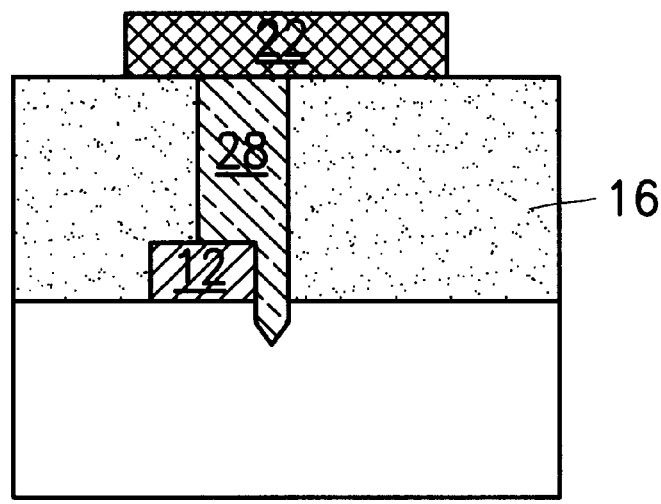
FIG. 3 is a cross-sectional view showing the landing and short-circuiting vias.
Figure 4A:
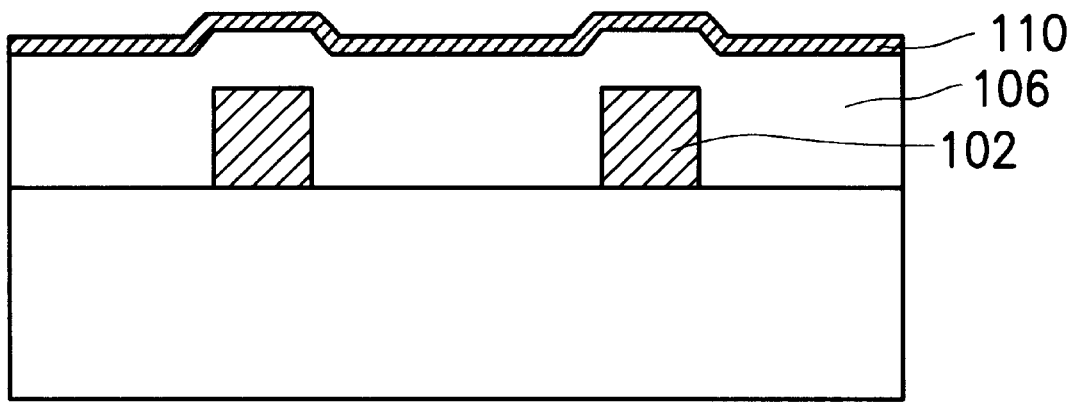
FIGS. 4A–4D are cross-sectional views showing the selected process stages of a method for fabricating via plugs in accordance with a preferred embodiment of the invention.

Refer to FIGS. 4A–4D for a description of a process for fabricating vias in the inter-metal dielectric layer for IC devices in accordance with a preferred embodiment of the invention. In FIG. 4A, interconnects 102 in a metal layer is formed over the surface of the circuit elements carried on the device substrate, with details of those circuit elements such as MOS transistors not being shown in the drawing.

An inter-metal dielectric layer 106 can be formed covering the interconnects 102 formed from the metal layer. This layer of inter-metal dielectric 106 can be formed in, for example, a high-density plasma chemical vapor deposition procedure. The thickness of the inter-metal dielectric layer 106 can be comparable to and only slightly thicker than that of the metal layer for the interconnects 102. This allows for the formation of the generally-smooth surface of the dielectric layer 106 as is illustrated in the drawing.

Then, as is illustrated, an etch-stopping layer 110 can be formed over the surface of the inter-metal dielectric layer 106. This stopping layer 1 10 can be a silicon-rich oxide or a silicon nitride layer that can be used to stop the etching in the main etching stage used for the formation of the via holes, as will be described later.

Figure 4B:
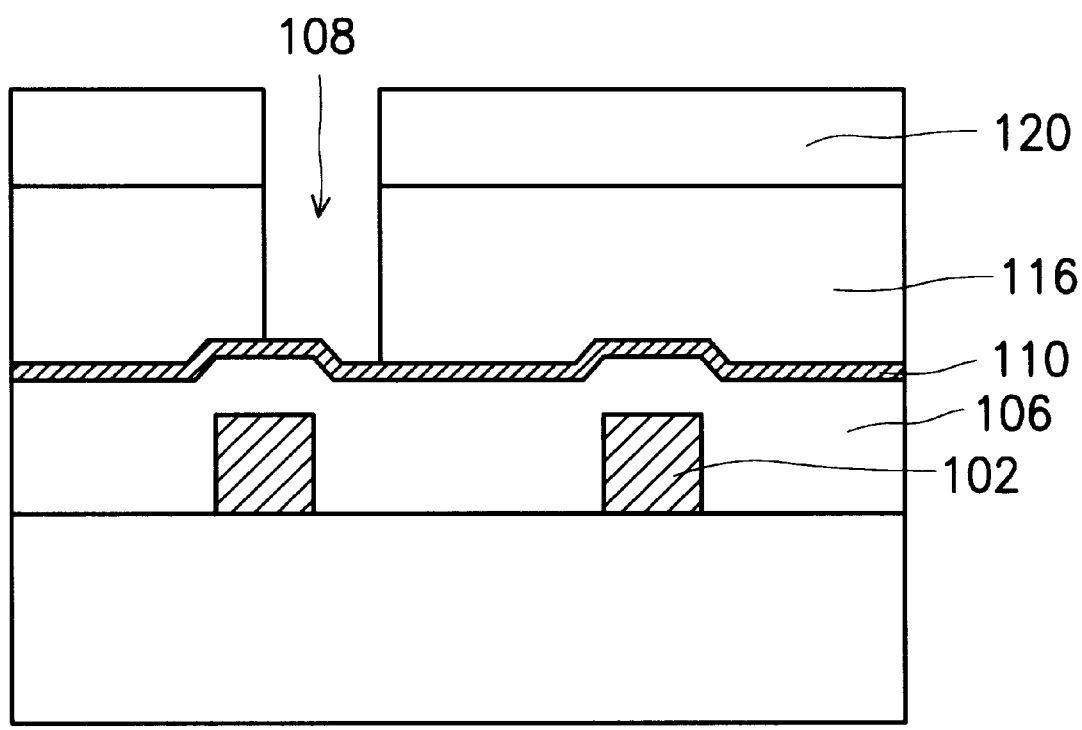

Refer to FIG. 4B, in which an inter-metal dielectric layer 116 is formed over the surface of the etch-stopping layer 110. In general, this inter-metal dielectric 116 must have a sufficient thickness to electrically insulate the metal layers above and below. As is appreciable for persons skilled in the art, the thickness is thus dependent on the material used for the dielectric.

After the formation of the inter-metal dielectric 116, a photoresist layer 120 is formed on top which is then patterned to reveal portions of the surface of the inter-metal dielectric 116 where the vias are intended. This is accomplished in a photolithographic procedure, which results in the configuration of FIG. 4B after proper etching is performed wherein one via 108 is shown to have been formed on the top region of the interconnect 102.

In the main etching stage of the etching procedure to remove the dielectric material in the via 108, the etch-stopping layer 110 serves to stop the etching simply because of its presence. This is unlike in the prior-art method wherein timing is the controlling measure to stop this main etching, stage. With the presence of the etch-stopping layer 110, timing control over the time period in which the main etching stage must conclude is no longer required to be in highly precise, and thus there is substantially no probability of over-etching in the vias 180 that would otherwise cause the landing condition that leads to undesirable short-circuiting. Thus, when the main etching stage is concluded, the vias 180 can be well controlled to have their bottoms resting on the top surface of the etch-stopping, layer 110.

Figure 4C:
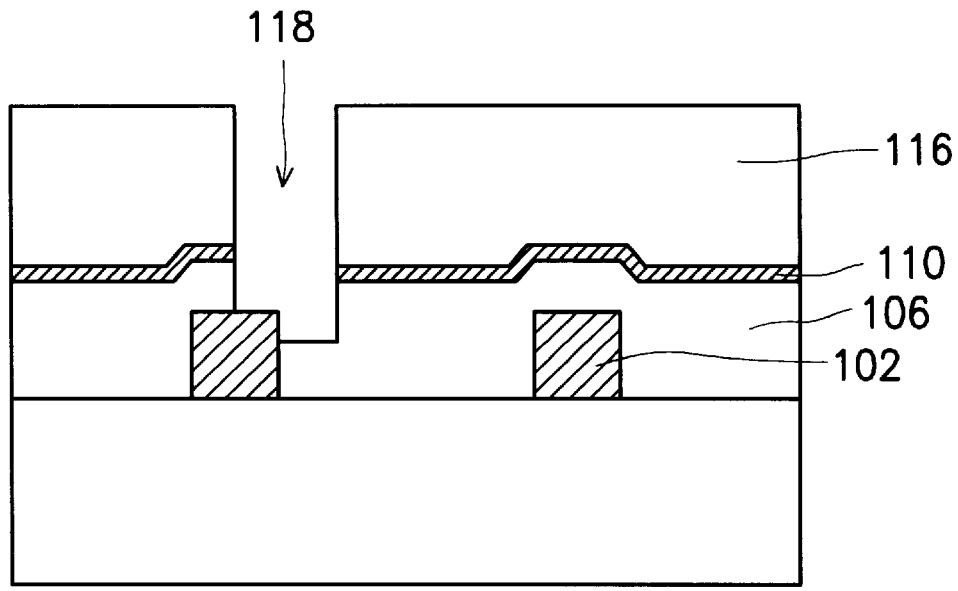

Then, in FIG. 4C, the over-etching stage following the main etching can be used to conclude the formation of the via holes. This involves the stripping off of the etch-stopping layer 110 and further etching into the inter-metal dielectric 106. Based on the known vertical distance between the lower surface of the etch-stopping layer 110 and the top surface of the interconnects 102 as well as the characteristics of the etchant used, the etching time can be determined. This can result in a proper etching depth into the inter-metal dielectric 106 so that the bottom of the via 118 rests adequately on the top surface of the interconnect 102. This not only allows for proper contact between the plug (to be formed in the vias 118) and the corresponding interconnect 12 but also prevents over-etching in the inter-metal dielectric 106 that causes short-circuiting with the circuit elements such as MOS transistors further deeply embedded in the device substrate.

Due to the fact that the distance between the etch-stopping layer 110 and the interconnects 102 is relatively short compared to the overall depth of the vias 118, it can therefore be ensured that the bottom surfaces of vias 118 may properly rest themselves at the right depth in the inter-metal dielectric layer 106. The vias 118 may have their bottoms formed at least in a region well within the acceptable range even though there are inevitable estimation tolerances as long as the distance is considered.

Figure 4D:
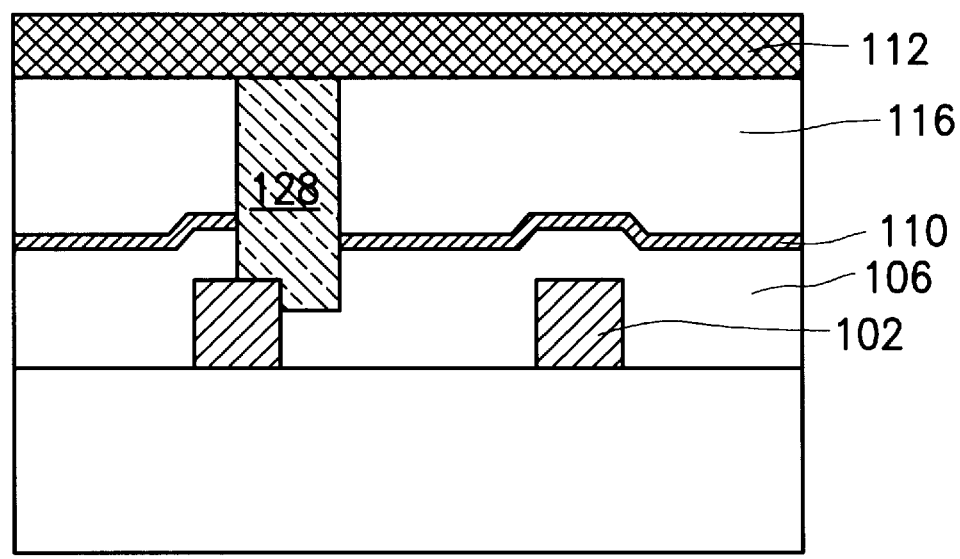

Then, as is illustrated in FIG. 4D, subsequent processing steps after the vias 118 are formed may be performed to make the plug inside. This may be implemented by the deposition of a selected electrically conductive material over the surface of the intermetal dielectric layer 116. In this deposition procedure, vias 118 are filled. Then, a dry etching or CMP procedure may be performed to effect the etch-back, so as to form the plugs 128. After the formation of these plugs 128, another deposition procedure may be performed to form another metal layer 112 that can be used to make another layer of interconnects in the subsequent processing steps.

Figure 5A:
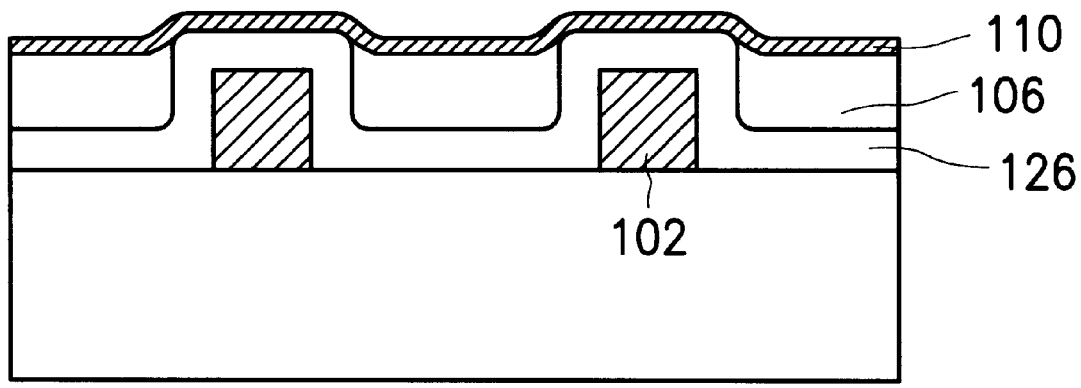
FIGS. 5A and 5B are cross-sectional views showing the selected process stages of a method for fabricating via plugs in accordance with another preferred embodiment of the invention.
Figure 5B:
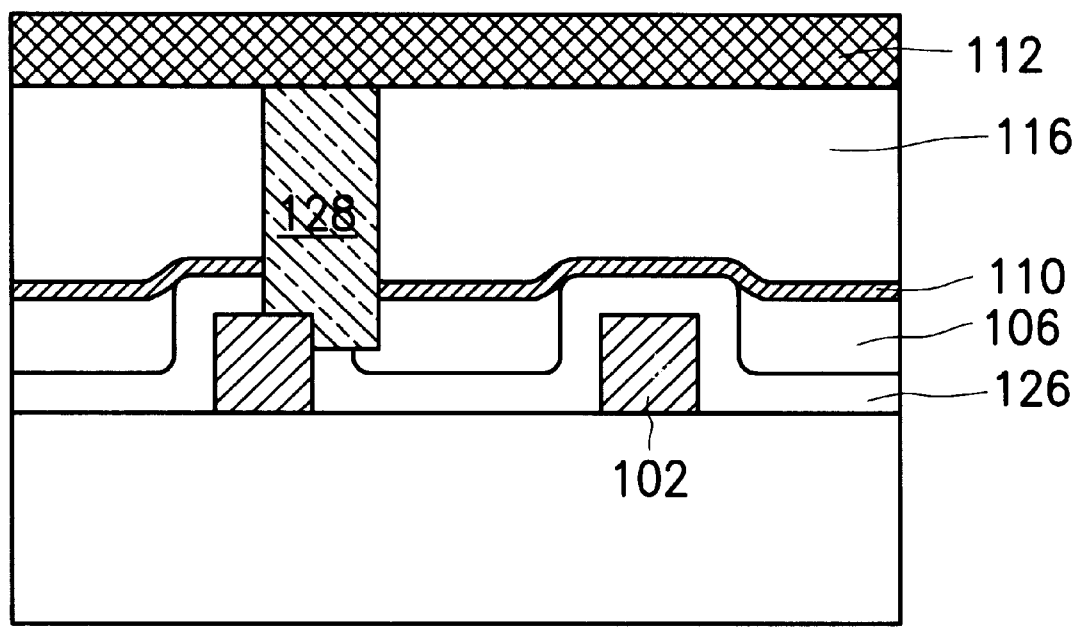

FIGS. 5A and 5B are cross-sectional views showing the selected process stages of a method for fabricating via plugs in accordance with another preferred embodiment of the invention. In this alternate embodiment, as is illustrated in FIG. 5A, after the formation of interconnects 102, an inter-metal dielectric layer 126 formed of a material having a relatively low dielectric constant can be formed before the high-density plasma inter-metal dielectric 106 is formed by deposition. This allows the method of the invention to be applicable to IC devices requiring low dielectric constant inter-metal dielectrics. In this alternate embodiment, the finished configuration shown in FIG. 5B is comparable to that shown in FIG. 4D of the first embodiment. To form a low dielectric constant inter-metal dielectric layer, materials including hydrogen silsesquioxane (HSQ), flare and aerogel can be used.

Thus, since the method of the invention may achieve good control over the proper reaching of the vias at the adequate depth in the inter-metal dielectric layer of an IC device, device defects can be effectively reduced. These defects include open-circuiting caused by plugs formed inside unlanded vias and short-circuiting caused by plugs in over-penetrating, landed vias. With the reduction of occurrences of such defects, IC device fabrication yield rates can be improved as a direct result.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating vias in a semiconductor integrated circuit device, comprising:

forming interconnects from a metal layer on the substrate of the semiconductor integrated circuit device;

forming a first dielectric layer covering the surface of the interconnects, the first dielectric layer including a first region over the respective interconnects, the first region having a first thickness over the respective interconnects;

forming an etch-stopping layer on top of the first dielectric layer;

forming a second dielectric layer on top of the etch-stopping layer, the second dielectric layer including a second region over the respective interconnects, the second region having a second thickness over the respective interconnects, the second thickness being greater than the first thickness;

forming a photoresist layer covering the second dielectric layer and revealing surface regions designated for the formation of the vias;

performing a main etching procedure to etch into the second dielectric layer down to the surface of the etch-stopping layer to form a first section of the vias, the first section of the vias having a depth within the second region of the second dielectric layer that is equal to the second thickness, and performing an over-etching procedure to strip of the etch-stopping layer and further etching into the first dielectric layer to form a second section of the vias, and stopping the etching when the surface of the interconnects are revealed to conclude the formation of the vias.

2. The method of fabricating vias according to claim 1, wherein a low dielectric constant inter-metal dielectric layer is formed covering the interconnects before the formation of the first dielectric layer.

3. The method of fabricating vias according to claim 2, wherein the low dielectric constant inter-metal dielectric layer is formed of a material selected from the group consisting of hydrogen silsesquioxane (HSQ), flare and aerogel.

4. The method of fabricating vias according to claim 1, wherein the first dielectric layer is formed in a high-density plasma chemical vapor deposition procedure.

5. The method of fabricating vias according to claim 1, wherein the first dielectric layer has a thickness slightly greater than the thickness of the metal layer forming the interconnects.

6. The method of fabricating vias according to claim 1, wherein the etch-stopping layer is a silicon-rich oxide layer.

7. The method of fabricating vias according to claim 1, wherein the etch-stopping layer is a silicon nitride layer.

8. The method of fabricating vias according to claim 1, wherein the second dielectric layer is an inter-metal dielectric layer.

9. The method of fabricating vias according to claim 1, wherein the over-etching procedure includes determining the distance between the etch-stopping layer and the interconnects;

and performing the over-etching procedure for a time period dependent on the determined distance.

10. The method of fabricating vias according to claim 1, wherein the first dielectric layer is formed in direct contact with the surface of the interconnects, the etch-stopping layer is formed in direct contact with the first dielectric layer, the second dielectric layer is formed in direct contact with the etch-stopping layer, and the photoresist layer is formed in direct contact with the second dielectric layer.

11. The method of fabricating vias according to claim 1, wherein the interconnects are formed to rise above a surface of the substrate.

12. The method of fabricating vias according to claim 11, wherein the first dielectric layer has a further thickness in a further region adjacent to and contiguous with the second region, the further thickness being greater than the second thickness.

13. The method of fabricating vias according to claim 12, wherein the further thickness is greater than a thickness of the interconnects.

* * * * *